(12) United States Patent
Ko et al.

(10) Patent No.: US 9,362,468 B2
(45) Date of Patent: Jun. 7, 2016

(54) CURABLE COMPOSITION

(71) Applicant: LG CHEM, LTD., Seoul (KR)

(72) Inventors: Min Jin Ko, Daejeon (KR); Jae Ho Jung, Daejeon (KR); Bum Gyu Choi, Daejeon (KR); Dae Ho Kang, Daejeon (KR); Min Kyoun Kim, Daejeon (KR); Byung Kyu Cho, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/606,532

(22) Filed: Jan. 27, 2015

(65) Prior Publication Data

US 2015/0141607 A1    May 21, 2015

Related U.S. Application Data

(63) Continuation of application No. PCT/KR2013/006799, filed on Jul. 29, 2013.

(30) Foreign Application Priority Data

Jul. 27, 2012  (KR) .................. 10-2012-0082688
Jul. 29, 2013  (KR) .................. 10-2013-0089716

(51) Int. Cl.
| | | |
|---|---|---|
| *C08G 77/04* | (2006.01) | |
| *H01L 33/56* | (2010.01) | |
| *C08L 83/04* | (2006.01) | |
| *H01L 23/29* | (2006.01) | |
| *G02F 1/1335* | (2006.01) | |
| *C08G 77/12* | (2006.01) | |
| *C08G 77/20* | (2006.01) | |
| *C08G 77/00* | (2006.01) | |
| *C08G 77/14* | (2006.01) | |

(52) U.S. Cl.
CPC ............... *H01L 33/56* (2013.01); *C08G 77/04* (2013.01); *C08L 83/04* (2013.01); *G02F 1/133603* (2013.01); *G02F 1/133617* (2013.01); *H01L 23/293* (2013.01); *C08G 77/12* (2013.01); *C08G 77/14* (2013.01); *C08G 77/20* (2013.01); *C08G 77/70* (2013.01); *C08G 77/80* (2013.01); *C08G 2190/00* (2013.01); *H01L 2924/0002* (2013.01)

(58) Field of Classification Search
None
See application file for complete search history.

(56) References Cited

U.S. PATENT DOCUMENTS

| 5,248,739 A * | 9/1993 | Schmidt ................. C09J 183/04 428/447 |
| 7,282,270 B2 * | 10/2007 | Morita .................... C08L 83/04 428/447 |
| 8,846,828 B2 | 9/2014 | Sagawa et al. |
| 2004/0241927 A1 * | 12/2004 | Kato ........................ C08K 5/56 438/202 |
| 2006/0264583 A1 * | 11/2006 | Kashiwagi .............. C08L 83/04 525/478 |
| 2007/0112147 A1 * | 5/2007 | Morita .................... C08L 83/04 525/478 |
| 2008/0255304 A1 * | 10/2008 | Nakashima ............. C08L 83/04 525/100 |
| 2009/0263936 A1 * | 10/2009 | Fujisawa ................. C08L 83/04 438/118 |
| 2011/0160410 A1 * | 6/2011 | Sagawa ................... C08L 83/06 525/478 |
| 2012/0056236 A1 * | 3/2012 | Hamamoto ............. C08L 83/04 257/100 |
| 2013/0009201 A1 * | 1/2013 | Ko .......................... C08L 83/04 257/100 |
| 2013/0014820 A1 * | 1/2013 | Ko ....................... H01L 31/0481 136/257 |
| 2013/0187176 A1 * | 7/2013 | Ko ......................... C08G 77/20 257/88 |
| 2014/0114042 A1 * | 4/2014 | Ko ......................... C08G 77/04 528/31 |

FOREIGN PATENT DOCUMENTS

| JP | 11-181289 A | 7/1999 | |
| JP | 11-274571 A | 10/1999 | |
| JP | 2001-196151 A | 7/2001 | |
| JP | 2002-226551 A | 8/2002 | |
| JP | 2008-274270 A | 11/2008 | |
| JP | 2010-13503 A | 1/2010 | |
| JP | 2012-33462 A | 2/2012 | |
| JP | 2012-124428 A | 6/2012 | |
| KR | 10-2008-0104279 A | 12/2008 | |
| KR | 10-2009-0028720 A | 3/2009 | |
| KR | 10-2011-0031287 A | 3/2011 | |
| KR | WO 2011090363 A2 * | 7/2011 | ........... H01L 31/048 |
| KR | 10-2011-0087244 A | 8/2011 | |
| WO | 2011/090362 A2 | 7/2011 | |
| WO | 2011/090364 A2 | 7/2011 | |

OTHER PUBLICATIONS

International Search Report issued in International Application No. PCT/KR2013/006799 on Oct. 17, 2013, 2 pages.
Supplementary European Search Report issued in European Patent Application No. 13822953.9 on Feb. 2, 2016, 5 pages.
Office Action issued in Japanese Patent Application No. 2015-524194 on Jan. 18, 2016, 4 pages.
Database WPI, Week 201152, Thomson Scientific, London, GB; AN 2011-J61783, XP 002753449, 3 pages.

* cited by examiner

*Primary Examiner* — Robert S Loewe
(74) *Attorney, Agent, or Firm* — Rothwell, Figg, Ernst & Manbeck, P.C.

(57) ABSTRACT

Provided are a curable composition and its use. The curable composition having excellent processability, workability, heat resistance, and light resistance, and having no problem of discoloring despite using for a long time may be provided. The curable composition which may scatter light and disperse linearity of light when used as an encapsulant of an optical semiconductor such as an LED may be provided.

18 Claims, No Drawings

CURABLE COMPOSITION

CROSS REFERENCE TO RELATED APPLICATIONS

The present application is a continuation of International Application No. PCT/KR2013/006799, with an international filing date of Jul. 29, 2013, which claims priority to and the benefit of Korean Patent Application No. 10-2012-0082688 filed on Jul. 27, 2012, and Korean Patent Application No. 10-2013-0089716 filed on Jul. 29, 2013, the disclosures of which are incorporated herein by reference in their entireties.

TECHNICAL FIELD

The present application relates to a curable composition and its use.

BACKGROUND ART

A light-emitting diode (LED), particularly a blue or ultraviolet (UV) LED having an emission wavelength of approximately 250 nm to 550 nm, is a high-brightness product using a GaN-based compound semiconductor such as GaN, GaAlN, InGaN, or InAlGaN. In addition, it is possible to form a high-quality full-color image by a method of combining red and green LEDs with a blue LED. For example, a technique of manufacturing a white LED by combining a blue or UV LED with a fluorescent material is known. Such LEDs are widely used as backlights for liquid crystal displays (LCDs) or as light.

Since light emitted from an LED has high linearity, it may be necessary to disperse the light in various directions. When the high-linear light is directly observed with the naked eye, the eyes may be very tired, and in some cases, may be damaged. To disperse the high-linear light, inorganic particles such as silica may be blended to an encapsulant of the LED, but the blended inorganic particles may precipitate due to density difference, or increase viscosity of a resin, thereby having an effect on processability. While it may be considered that light is scattered by blending polymer particles, since the polymer particles do not usually have sufficient heat resistance or light resistance, discoloration may be a problem when the particles are used for a long time.

As an LED encapsulant, an epoxy resin having high adhesive strength and excellent mechanical durability is widely used. However, the epoxy resin has a lower light transmittance in a blue light or UV ray region, and low light resistance. For example, Japanese Patent Application No. H11-274571, 2001-196151, and 2002-226551 present techniques for solving the above-described problems.

DISCLOSURE OF THE INVENTION

Technical Problem

The present application provides a curable composition and its use.

Technical Solution

One aspect of the present application provides a curable composition including components that can be cured by hydrosilylation, for example, a reaction between an aliphatic unsaturated bond and a hydrogen atom. For example, the curable composition may include at least one polyorganosiloxane including an aliphatic unsaturated bond, and at least one silicon compound including a hydrogen atom binding to a silicon atom.

For example, the curable composition may include a polyorganosiloxane having an average empirical formula of Formula 1 (hereinafter, referred to as "polyorganosiloxane (A)"); a polyorganosiloxane having an average empirical formula of Formula 2 (hereinafter, referred to as "polyorganosiloxane (B)"); and a compound of Formula 3 (hereinafter, referred to as "compound (C)").

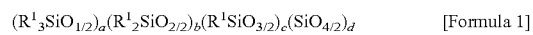  [Formula 1]

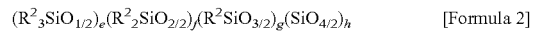  [Formula 2]

  [Formula 3]

In Formulas 1 to 3, $R^1$, $R^2$, and Y may be each independently an epoxy group or a monovalent hydrocarbon group, a may be 0 or a positive number, b may be a positive number, c may be 0 or a positive number, d may be 0 or a positive number, b/(b+c+d) may be 0.65 or more, e, f, g, and h may each be 0 or a positive number, f/(f+g+h) may be less than 0.65, i may be 0.2 to 1, and j may be 0.9 to 2. Here, at least one or both of the components of Formulas 1 and 2 are aliphatic unsaturated bonds, and may include an alkenyl group. Accordingly, at least one of $R^1$ and/or at least one of $R^2$ may be an alkenyl group. In addition, as to be described later, for example, when the component of Formula 1 includes an alkenyl group, and the component of Formula 2 does not include an alkenyl group, a curable composition has the same average empirical formula as that of the component of Formula 2, and further includes a component including at least one alkenyl group. In another embodiment, when the component of Formula 1 does not include an alkenyl group, and the component of Formula 2 includes an alkenyl group, the curable composition has the same average empirical formula as that of the component of Formula 1, and may further include a component including at least one alkenyl group.

The expression "polyorganosiloxane is represented as a certain average empirical formula" used herein means that the polyorganosiloxane is a single component represented as the certain average empirical formula, or a mixture of at least two components, and an average of compositions of components in the mixture is represented as the average empirical formula.

The term "M unit" used herein may refer to a monofunctional siloxane unit possibly represented as $(R_3SiO_{1/2})$ in the art, the term "D unit" used herein may refer to a bifunctional siloxane unit possibly represented as $(R_2SiO_{2/2})$ in the art, the term "T unit" used herein may refer to a trifunctional siloxane unit possibly represented as $(RSiO_{3/2})$ in the art, and the term "Q unit" used herein may refer to a tetrafunctional siloxane unit possibly represented as $(SiO_{4/2})$. Here, R is a functional group binding to a silicon (Si) atom, and may be, for example, a hydrogen atom, an epoxy group, or a monovalent hydrocarbon group.

The term "epoxy group" used herein may refer to, unless particularly defined otherwise, a monovalent residue derived from a cyclic ether having three ring-forming atoms or a compound including the cyclic ether. The epoxy group may be a glycidyl group, an epoxyalkyl group, a glycidoxyalkyl group, or an alicyclic epoxy group. An alicyclic epoxy group may refer to a monovalent residue derived from a compound including an aliphatic hydrocarbon ring structure, and a structure of an epoxy group formed by two carbon atoms of the aliphatic hydrocarbon ring. The alicyclic epoxy group may be an alicyclic epoxy group having 6 to 12 carbon atoms, for example, a 3,4-epoxycyclohexylethyl group.

The term "monovalent hydrocarbon group" used herein, unless particularly defined otherwise, may refer to a monovalent residue derived from a compound composed of carbon and hydrogen or a derivative thereof. For example, the monovalent hydrocarbon group may include 1 to 25 carbon atoms. The monovalent hydrocarbon group may be an alkyl group, an alkenyl group, an alkynyl group, or an aryl group.

The term "alkyl group" used herein may refer to, unless particularly defined otherwise, an alkyl group having 1 to 20 carbon atoms, 1 to 16 carbon atoms, 1 to 12 carbon atoms, 1 to 8 carbon atoms, or 1 to 4 carbon atoms. The alkyl group may have a linear, branched, or cyclic structure. In addition, the alkyl group may be optionally substituted with at least one substituent.

The term "alkenyl group" used herein may refer to, unless particularly defined otherwise, an alkenyl group having 2 to 20 carbon atoms, 2 to 16 carbon atoms, 2 to 12 carbon atoms, 2 to 8 carbon atoms, or 2 to 4 carbon atoms. The alkenyl group may have a linear, branched, or cyclic structure, and may be optionally substituted with at least one substituent.

The term "alkynyl group" used herein may refer to, unless particularly defined otherwise, an alkynyl group having 2 to 20 carbon atoms, 2 to 16 carbon atoms, 2 to 12 carbon atoms, 2 to 8 carbon atoms, or 2 to 4 carbon atoms. The alkynyl group may have a linear, branched, or cyclic structure, and may be optionally substituted with at least one substituent.

The term "aryl group" used herein may refer to, unless particularly defined otherwise, a monovalent residue derived from a compound including a benzene ring or a structure in which at least two benzene rings are condensed or connected by a covalent bond with one or two carbon atoms, or a derivative thereof. In the range of the aryl group, a functional group conventionally referred to as an aralkyl group or arylalkyl group may be included, in addition to a functional group conventionally referred to as an aryl group. The aryl group may be, for example, an aryl group having 6 to 25 carbon atoms, 6 to 21 carbon atoms, 6 to 18 carbon atoms, or 6 to 12 carbon atoms. The aryl group may be a phenyl group, a dichlorophenyl group, a chlorophenyl group, a phenylethyl group, a phenylpropyl group, a benzyl group, a tolyl group, a xylyl group, or a naphthyl group.

As a substituent that may be optionally substituted to an epoxy group or a monovalent hydrocarbon group, a halogen such as chlorine or fluorine, a glycidyl group, an epoxyalkyl group, a glycidoxyalkyl group, an epoxy group such as an alicyclic epoxy group, an acryloyl group, a methacryloyl group, an isocyanate group, a thiol group, or a monovalent hydrocarbon group may be used, but the present application is not limited thereto.

The polyorganosiloxane (A) may have, for example, a linear or partially-crosslinked structure. The term "linear structure" may refer to a structure of a polyorganosiloxane composed of the M and D units. In addition, the term "partially-crosslinked structure" may refer to a sufficiently long linear structure of a polyorganosiloxane, which is derived from the D unit, and to which the T or Q unit, for example, the T unit is partially introduced. In one embodiment, the polyorganosiloxane having a partially-crosslinked structure may refer to a polyorganosiloxane having a ratio of the D unit with respect to all D, T and Q units, that is, b/(b+c+d) of 0.65 or more, or 0.7 or more to less than 1. When the polyorganosiloxane (A) is linear, b/(b+c+d) is 1.

In the average empirical formula of Formula 1, a, b, c, and d are molar ratios of respective siloxane units included in the polyorganosiloxane (A). For example, when the sum (a+b+c+d) of the molar ratios is adjusted to be 1, a may be 0 to 0.5, or 0.01 to 0.15, b may be 0.3 to 0.98, or 0.5 to 0.9, c may be 0 to 0.3, or 0 to 0.2, and d may be 0 to 0.2, or 0 to 0.1. When the polyorganosiloxane (A) has a partially-crosslinked structure, c may be 0.01 to 0.30. In addition, b/(b+c+d) may be 0.65 or more, 0.65 to 1, or 0.7 to 1. When the polyorganosiloxane (A) has a partially-crosslinked structure, b/(b+c+d) may be 0.65 or more, or 0.7 or more, and less than 1, 0.65 to 0.97, or 0.7 to 0.97. As the ratios of the siloxane units are controlled as described above, suitable physical properties according to applications can be ensured.

The polyorganosiloxane (A) may or may not include an aliphatic unsaturated bond or at least one functional group including the same, for example, an alkenyl group. When the polyorganosiloxane (A) includes the functional group, at least one of $R^1$ in Formula 1 may be an alkenyl group. In this case, a ratio (Ak/Si) of moles of total aliphatic unsaturated bonds or functional groups including the same (Ak) with respect to moles of all silicon atoms (Si) in the polyorganosiloxane (A) may be 0.2 or less, or 0.15 or less. The ratio (Ak/Si) may also be 0.01 or more, or 0.02 or more. When the polyorganosiloxane (A) includes the aliphatic unsaturated bond, by controlling the ratio (Ak/Si) as described above, curability may be suitably maintained, leakage of unreacted components from a surface of the cured product may be prevented, and crack resistance of the cured product may be excellently maintained. As described above, when the polyorganosiloxane (A) does not include an aliphatic unsaturated bond, when necessary, the curable composition may further include a polyorganosiloxane having the same average empirical formula as that of the polyorganosiloxane (A), that is, the average empirical formula of Formula 1, at least one of R1 being an alkenyl group, and having the above-described ratio (Ak/Si) (hereinafter, referred to as "polyorganosiloxane (D)").

The polyorganosiloxane (A) may or may not include at least one aryl group, for example, an aryl group binding to a silicon atom. For example, according to the presence of the aryl group or the control of the ratio, a relationship in a refractive index between components may be controlled. When the polyorganosiloxane (A) includes an aryl group, at least one of $R^1$ in Formula 1 may be an aryl group. For example, the ratio (Ar/Si) of moles of the aryl groups (Ar) binding to all silicon atoms included in the polyorganosiloxane (A) with respect to moles of the all silicon atoms (Si) in the polyorganosiloxane (A) may be 1.5 or less. The ratio (Ar/Si) may be, for example, 0.5 or more.

In the above range, a difference in a refractive index between the polyorganosiloxane (B) and the compound (C) may be controlled in a suitable range. Accordingly, the composition may have excellent processability and workability, and moisture resistance, light dispersity, light transmittance, and hardness, after curing.

The polyorganosiloxane (A) may include a unit of Formula 4 and a unit of Formula 5 as D units.

$(R^1R^2SiO_{2/2})$           [Formula 4]

$(R^3{}_2SiO_{2/2})$           [Formula 5]

In Formulas 4 and 5, $R^1$ and $R^2$ are each independently an epoxy group or a monovalent hydrocarbon group, and $R^3$ is an aryl group. In one embodiment, the $R^1$ and $R^2$ may be each independently an alkyl group.

In the polyorganosiloxane (A), a ratio (Dm/Dp) of moles of the siloxane unit of Formula 4 (Dm) with respect to moles of the siloxane unit of Formula 5 (Dp) may be, for example, approximately 0.3 to 2.0, 0.3 to 1.5, or 0.5 to 1.5. Within such a range of the ratio, excellent light transmittance and mechanical strength, no surface stickiness, and long-lasting durability by controlling moisture and gas permeability can be ensured.

A percentage (100×Dp/D) of a ratio of moles of the siloxane unit of Formula 5 (Dp) with respect to moles of all D units (D) included in the polyorganosiloxane (A) may be approximately 30% or more, 30% to 65%, or 30% to 60%. Within such a range of the percentage, light transmittance and mechanical strength are excellent, there is no surface stickiness, and moisture and gas permeability can be controlled to ensure long-lasting durability.

A percentage (100×Dp/ArD) of a ratio of moles of the siloxane unit of Formula 5 (Dp) with respect to moles of a D unit including an aryl group (ArD) among all D units included in the polyorganosiloxane (A) may be 70% or 80% or more. The upper limit of the percentage (100×Dp/ArD) is not particularly limited, and may be, for example, 100%. Within such a range of the percentage, the composition can exhibit excellent processability and workability, before curing, and excellently maintain mechanical strength, gas permeability, moisture resistance, light transmittance, refractive index, light extraction efficiency, and hardness, after curing.

When the polyorganosiloxane (A) has a partially-crosslinked structure, it may include a unit of Formula 6 or 7.

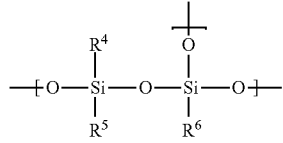

[Formula 6]

In Formula 6, $R^4$, $R^5$, and $R^6$ are each independently an alkyl group having 1 to 20 carbon atoms, an alkenyl group having 2 to 20 carbon atoms, or an aryl group having 6 to 25 carbon atoms. In Formula 6, at least one of $R^4$, $R^5$, and $R^6$ may be an alkenyl group. In addition, in Formula 6, $R^6$ may be, in another example, an aryl group, for example, an aryl group having 6 to 25 carbon atoms, 6 to 21 carbon atoms, 6 to 18 carbon atoms, or 6 to 13 carbon atoms, or a phenyl group.

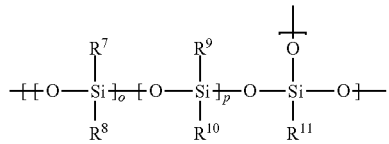

[Formula 7]

In Formula 7, $R^7$ is an aryl group having 6 to 25 carbon atoms, $R^8$ to $R^{10}$ are each independently an alkyl group having 1 to 20 carbon atoms, an alkenyl group having 2 to 20 carbon atoms, or an aryl group having 6 to 25 carbon atoms, and $R^{11}$ is an alkyl group having 1 to 20 carbon atoms or an aryl group having 6 to 25 carbon atoms. In Formula 6, at least one of $R^8$ to $R^{10}$ may be an alkenyl group.

The polyorganosiloxane (A) having an illustrative partially-crosslinked structure may include at least one of the units of Formulas 6 and 7. The unit of Formula 6 or 7 is of a type in which a silicon atom of the D unit and a silicon atom of the T unit among the siloxane units included in the polyorganosiloxane (A) are directly bound to each other by means of an oxygen atom. When the polyorganosiloxane (A) is a mixture of at least two components and represented as an average empirical formula of Formula 1, it may include at least one of single components having the unit of Formula 6 or 7. The polyorganosiloxane including the unit of Formula 6 or 7 may be prepared by, for example, ring-opening polymerization which will be described later. According to the method, a polyorganosiloxane including the unit of Formula 6 or 7, and minimized silicon atoms binding to an alkoxy group and silicon atoms binding to a hydroxyl group can be prepared.

The polyorganosiloxane (A) may have a ratio (OR/Ak) of an area (OR) of a peak derived from an alkoxy group binding to a silicon atom with respect to an area (Ak) of a peak derived from an alkenyl group binding to a silicon atom in a spectrum obtained by $^1$H NMR of 0.05 or less, 0.03 or less, 0.01 or less, 0.005 or less, or 0. In the above range, suitable viscosity can be exhibited, and other physical properties can be excellently maintained.

The polyorganosiloxane (A) or the polymerization product including the same may have an acid value obtained by KOH titration of 0.05 mgKOH/g or less, 0.03 mgKOH/g or less, 0.01 mgKOH/g or less, or 0 mgKOH/g. In the above range, suitable viscosity can be exhibited, and other physical properties can also be excellently maintained.

The polyorganosiloxane (A) or the polymerization product including the same may have a viscosity at 25° C. of 500 cP or more, 1,000 cP or more, 2,000 cP or more, 3,000 cP or more, 4,000 cP or more, 5,000 cP or more, 7,000 cP or more, 9,000 cP or more, or 9500 cP or more. In the above range, processability of the curable composition and hardness after curing may be suitably maintained. The upper limit of the viscosity is not particularly limited, and the viscosity may be, for example, 300,000 cP or less, 100,000 cP or less, 90,000 cP or less, 80,000 cP or less, 70,000 cP or less, or 65,000 cP or less.

The polyorganosiloxane (A) or the polymerization product including the same may have a weight average molecular weight (Mw) of 1,000 to 1,000,000 or 1,000 to 100,000. The term "weight average molecular weight" used herein may refer to a conversion value with respect to standard polystyrene measured by gel permeation chromatography (GPC). Unless particularly defined otherwise, the term "molecular weight" used herein may refer to a weight average molecular weight. In the range of the molecular weight described above, moldability, and hardness and strength after curing of the curable composition can be suitably maintained.

The polyorganosiloxane (A) may be prepared by ring-opening polymerization of a cyclic siloxane compound. For example, the polyorganosiloxane (A) may be a component included in a ring-opening polymerization product of a mixture including the cyclic polyorganosiloxane. The polymerization product may include a low molecular weight cyclic compound, along with the polyorganosiloxane (A) according to the polymerization result. The term "low molecular weight cyclic compound" may be a cyclic compound, for example, cyclic polyorganosiloxane, having a molecular weight of 800, 750 or less, or 700 or less. The polymerization product may include a low molecular weight cyclic compound in an amount of, for example, 10 weight % or less, 7 weight % or less, 5 weight % or less, or 3 weight % or less. The lower limit of the ratio of the cyclic compound may be, for example, 0 weight % or 1 weight %. By controlling the above-described ratio, a cured product having excellent long-term reliability and crack resistance can be provided.

The low molecular weight cyclic compound may include, for example, a compound represented by Formula 8.

[Formula 8]

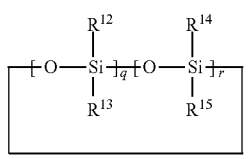

In Formula 8, $R^{12}$ and $R^{13}$ may be each independently an alkyl group, $R^{14}$ and $R^{15}$ may be each independently an aryl group, q and r may be 0 or a positive number, and a sum (g+r) of g and r may be 2 to 10, 3 to 10, 3 to 9, 3 to 8, 3 to 7, or 3 to 6.

The cyclic polyorganosiloxane included in the mixture forming the polyorganosiloxane (A) by ring-opening polymerization may be, for example, a compound represented by Formula 9.

[Formula 9]

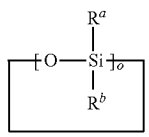

In Formula 9, $R^a$ and $R^b$ are each independently a monovalent hydrocarbon group, and o is 3 to 6.

The cyclic polyorganosiloxane included in the mixture forming the polyorganosiloxane (A) by ring-opening polymerization may be, in another example, a mixture of a compound of Formula 10 and a compound of Formula 11.

[Formula 10]

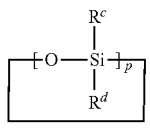

[Formula 11]

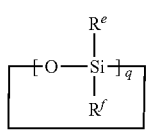

In Formulas 10 and 11, $R^c$ and $R^d$ are alkyl groups, $R^e$ and $R^f$ are aryl groups, p is a number of 3 to 6, and q is a number of 3 to 6.

In Formulas 9 to 11, specific kinds of $R^a$ to $R^f$, specific values of o, p, and q, and ratios of the components in the mixture may be determined by, for example, a desired structure of the polyorganosiloxane (A).

When the polyorganosiloxane (A) has a partially-crosslinked structure, the mixture applied to the ring-opening polymerization may further include, for example, a compound having an average empirical formula of Formula 12, or a compound having an average empirical formula of Formula 13.

 [Formula 12]

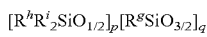 [Formula 13]

In Formulas 12 and 13, $R^g$ to $R^i$ are each independently a monovalent hydrocarbon group, p is 1 to 3, and q is 1 to 10.

When the polyorganosiloxane having an average empirical formula of Formula 13 has a partial cage structure, p may be 1 to 2, and q may be 3 to 10.

In Formulas 12 and 13, specific kinds of $R^g$ to $R^i$, specific values of p and q, and ratios of the components in the mixture may be determined by, for example, a desired structure of the polyorganosiloxane (A).

When the cyclic polyorganosiloxane, for example, at least one of polyorganosiloxanes of Formulas 9 to 11, reacts with a polyorganosiloxane having a cage or partial cage structure such as Formula 12 or 13, a polyorganosiloxane having a desired structure may be synthesized at a suitable molecular weight. In addition, according to the method, by minimizing a functional group such as an alkoxy group or a hydroxyl group binding to a silicon atom in the polyorganosiloxane or a polymerization product including the same, a desired product having excellent physical properties may be prepared.

In one embodiment, the mixture applied to ring-opening polymerization may further include a compound represented by Formula 14.

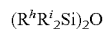 [Formula 14]

In Formula 14, $R^h$ and $R^i$ are each a monovalent hydrocarbon group.

In Formula 14, a specific kind of the monovalent hydrocarbon group or a blending ratio in the mixture may be determined by a desired polyorganosiloxane (A).

A reaction of each component in the mixture may be performed in the presence of a suitable catalyst. Accordingly, the mixture may further include a catalyst.

As the catalyst, for example, a base catalyst may be used. A suitable base catalyst may be, but is not limited to, a metal hydroxide such as KOH, NaOH, or CsOH; a metal silanolate including an alkali metal compound and a siloxane; or a quaternary ammonium compound such as tetramethylammonium hydroxide, tetraethylammonium hydroxide, or tetrapropylammonium hydroxide.

A ratio of the catalyst in the mixture may be suitably selected in consideration of desired reactivity, and for example, may be 0.01 to 30 parts by weight, or 0.03 to 5 parts by weight with respect to 100 parts by weight of a total weight of the reaction products in the mixture. In the specification, unless particularly defined otherwise, units "parts by weight" refer to a weight ratio between components.

In one embodiment, the reaction of the mixture may be performed in the presence of a suitable solvent. As a solvent, any kind of solvent that can serve to suitably mix the reaction product in the mixture, that is, a disiloxane or polysiloxane, with the catalyst, and does not interfere with reactivity may be used. The solvent may be, but is not limited to, an aliphatic hydrocarbon-based solvent such as n-pentane, i-pentane, n-hexane, i-hexane, 2,2,4-trimethyl pentane, cyclohexane, or methylcyclohexane; an aromatic solvent such as benzene, toluene, xylene, trimethyl benzene, ethyl benzene, or methylethyl benzene; a ketone-based solvent such as methylethylketone, methylisobutylketone, diethylketone, methyl n-propyl ketone, methyl n-butyl ketone, cyclohexanone, methylcyclohexanone, or acetylacetone; an ether-based solvent such as tetrahydrofuran, 2-methyl tetrahydrofuran, ethyl ether, n-propyl ether, isopropyl ether, diglyme, dioxine, dimethyldioxine, ethyleneglycol monomethyl ether, ethyleneglycol dimethyl ether, ethyleneglycol diethyl ether, propyleneglycol monomethyl ether, or propyleneglycol dimethyl ether; an ester-based solvent such as diethyl carbonate, methyl acetate, ethyl acetate, ethyl lactate, ethyleneglycol monomethylether acetate, propyleneglycol monomethylether acetate, or ethyleneglycol diacetate; or an amide-based solvent such as N-methyl pyrrolidone, formamide, N-methyl formamide, N-ethyl formamide, N,N-dimethyl acetamide, or N,N-diethylacetamide.

The reaction of the mixture, for example, a ring-opening polymerization, may be performed by adding the catalyst at a reaction temperature ranging from, for example, 0° C. to 150° C., or 30° C. to 130° C. In addition, a reaction time may be controlled within a range of, for example, 1 hour to 3 days.

The polyorganosiloxane (B) included in the curable composition may be, for example, a crosslinkable polyorganosiloxane. The term "crosslinkable polyorganosiloxane" may refer to a polyorganosiloxane essentially including a T or Q unit as a siloxane unit, and having a ratio of a D unit with respect to a sum of all D, T, and Q units, for example, (f/(f+g+h)) in Formula 2, of less than 0.65.

The polyorganosiloxane (B) may or may not include an aliphatic unsaturated bond such as an alkenyl group. When the polyorganosiloxane (B) includes an aliphatic unsaturated group, at least one or two of $R^2$ in Formula 2 may be alkenyl groups. For example, the ratio (Ak/Si) of moles of the alkenyl groups (Ak) with respect to moles of all silicon atoms (Si) in the polyorganosiloxane (B) may be 0.4 or less, 0.35 or less, or 0.3 or less. The ratio (Ak/Si) may be, for example, 0.05 or 0.15 or more. When the polyorganosiloxane (B) includes an aliphatic unsaturated bond, as the molar ratio (Ak/Si) is controlled as described above, reactivity may be suitably maintained, and leakage of unreacted components from a surface of the cured product may be prevented. In addition, hardness, crack resistance, and thermal and shock resistance of the cured product can be excellently maintained. As described above, when the polyorganosiloxane (B) does not include an aliphatic unsaturated bond, as needed, the curable composition may further include a polyorganosiloxane having the same average empirical formula as the polyorganosiloxane (B), that is, the average empirical formula of Formula 2, at least one of $R^1$ being an alkenyl group, and having the above-described ratio (Ak/Si) (hereinafter, referred to as "polyorganosiloxane (E)").

The polyorganosiloxane (B) may or may not include at least one aryl group. For example, according to the presence of the aryl group and/or the control of its ratio, a relationship in a refractive index between components can be controlled. When the polyorganosiloxane (B) includes an aryl group, at least one of $R^2$ in Formula 2 may be an aryl group. For example, a ratio (Ar/Si) of moles of the aryl group (Ar) with respect to moles of all silicon atoms (Si) in the polyorganosiloxane (B) may be 1.2 or less. The ratio (Ar/Si) may be, for example, 0.4 or more. As the molar ratio (Ar/Si) is controlled as described above, a relationship in the refractive index with the polyorganosiloxane (A) can be controlled within a desired range, and a refractive index, gas permeability, moisture permeability, thermal and shock resistance, crack resistance, and hardness of the cured product, and viscosity of the composition can be suitably maintained.

In the average empirical formula of Formula 2, e, f, g, and h are each a molar ratio of siloxane units. For example, when a sum of the molar ratios (e+f+g+h) is adjusted to be 1, e may be 0 to 0.5 or 0.05 to 0.5, f may be 0 to 0.5 or 0 to 0.3, g may be 0 to 0.95, 0.2 to 0.95, or 0.2 to 0.85, and h may be 0 to 0.3 or 0 to 0.2. Here, the structure may be controlled such that (e+f)/(e+f+g+h) becomes 0.2 to 0.7 or 0.2 to less than 0.7. In addition, in the polyorganosiloxane (B), f/(f+g+h) may be less than 0.65, or 0.5, 0.4, or 0.3 or less. In addition, in Formula 2, g/(g+h) may be 0.8 or more. The lower limit of f/(f+g+h) is not particularly limited, and for example, f/(f+g+h) may be more than 0. In addition, the upper limit of g/(g+h) is not particularly limited, and for example, g/(g+h) may be 1.0.

The polyorganosiloxane (B) may have a viscosity at 25° C. of 5,000 cP or more, or 1,000,000 cP or more, and thus processability before curing and hardness after curing can be suitably maintained.

The polyorganosiloxane (B) may have a molecular weight of, for example, 800 to 100,000, or 1,000 to 100,000. As the molecular weight is controlled to 800 or more, moldability before curing and strength after curing can be effectively maintained, and as the molecular weight is controlled to 100,000 or less, the viscosity can be maintained at a suitable level.

A method of preparing the polyorganosiloxane (B) may be, for example, a method of preparing a polysiloxane conventionally known in the art, or a method similar to that of preparing the polyorganosiloxane (A) such as ring-opening polymerization.

The curable composition may further include a silicon compound including a hydrogen atom binding to a silicon atom (hereinafter, referred to as "silicon compound (C)"), which may be the compound of Formula 3. Formula 3 may be, for example, an average empirical formula of the silicon compound (C). The silicon compound (C) may have at least one or two hydrogen atoms binding to a silicon atom.

The silicon compound (C) may serve as a crosslinking agent for crosslinking a composition by a reaction with a functional group containing an aliphatic unsaturated bond of a polyorganosiloxane. For example, crosslinking and curing may be performed by an addition-reaction of a hydrogen atom of the silicon compound (C) with an aliphatic unsaturated bond of an alkenyl group of the polyorganosiloxane (A) and/or the polyorganosiloxane (B).

A ratio (H/Si) of moles of a hydrogen atom (H) binding to a silicon atom with respect to moles of all silicon atoms (Si) of the silicon compound (C) of Formula 3 may be 0.2 or more, or 0.3 or more. The ratio (H/Si) may also be 0.8 or less, or 0.75 or less. As the molar ratio (H/Si) is controlled to 0.2 or more, or 0.3 or more, curability of the composition can be excellently maintained, and as the molar ratio is controlled to 0.8 or less, or 0.75 or less, crack resistance and thermal and shock resistance can be excellently maintained.

The silicon compound (C) may or may not include at least one aryl group. For example, according to the presence of an aryl group and the control of its ratio, a relationship in a refractive index with the polyorganosiloxane (A) may be controlled. When the silicon compound (C) includes an aryl group, at least one of Y in Formula 3 may be an aryl group. For example, a ratio (Ar/Si) of moles of the aryl group (Ar) with respect to moles of all silicon atoms (Si) included in the silicon compound (C) is 1.5 or less. The ratio (Ar/Si) may be, for example, 0.3 or more. As the molar ratio (Ar/Si) is controlled as described above, the relationship in the refractive index with the polyorganosiloxane (A) can be controlled, the refractive index and hardness of the cured product can be maximized, and the viscosity and crack resistance of the composition can be suitably maintained.

The silicon compound (C) may have a viscosity at 25° C. of 0.1 cP to 100,000 cP, 0.1 cP to 10,000 cP, 0.1 cP to 1,000 cP, or 0.1 cP to 300 cP. In the above range of the viscosity, the processability of the composition and the hardness of the cured product can be excellently maintained.

In addition, the silicon compound (C) may have, for example, a molecular weight of less than 2000, less than 1000, or less than 800. When the molecular weight is 1000 or more, strength of the cured product may be degraded. The lower limit of the molecular weight of the silicon compound (C) is not particularly limited, and may be, for example, 250. In the silicon compound (C), the molecular weight may refer to a weight average molecular weight, or a conventional molecular weight of the compound.

A method of preparing the silicon compound (C) is not particularly limited, and may employ a conventional method of preparing a polyorganosiloxane known in the art, or a method similar to that of preparing the polyorganosiloxane (A).

The curable composition may, for example, satisfy Equation 1.

$$|A-B|>0.03 \quad \text{[Equation 1]}$$

In Equation 1, A is a refractive index of any one component of the polyorganosiloxane (A), the polyorganosiloxane (B), and the silicon compound (C), and B is a refractive index of a mixture of the other two components of the polyorganosiloxane (A), the polyorganosiloxane (B), and the silicon compound (C). The refractive index may refer to a refractive index with respect to light having a wavelength of 450 nm. In Equation 1, an absolute value of a difference between A and B may be, in another example, 0.04 or more, 0.05 or more, 0.06 or more, 0.07 or more, or 0.08 or more. The absolute value of a difference between A and B may be, for example, 5 or less, 4.5 or less, 4 or less, 3.5 or less, 3 or less, 2.5 or less, 2 or less, or 1.5 or less.

In Equation 1, A may be a refractive index of the polyorganosiloxane (A), and B may be a refractive index of a mixture of the polyorganosiloxane (B) and the silicon compound (C). In another example, in Equation 1, A may be a refractive index of the polyorganosiloxane (B), and B may be a refractive index of a mixture of the polyorganosiloxane (A) and the silicon compound (C).

In the relationship of Equation 1, the component exhibiting the refractive index (A), that is, the component exhibiting a different refractive index from that of the mixture of the other two components, as described above, may or may not include a functional group participating in hydrosilylation such as an alkenyl group. However, to achieve suitable physical properties, the functional group participating in hydrosilylation, for example, an alkenyl group or a hydrogen atom binding to a silicon atom may be included.

When respective components are selected to satisfy Equation 1, for example, the component (that is, the component having a refractive index A) having a different refractive index from the other two components (that is, the mixture having a refractive index B) may be phase-separated, and scattering or dispersion of light due to the difference in the refractive index between the components may be caused. Accordingly, for example, when the curable composition is used as an encapsulation material of an LED, linearity of the LED can be effectively controlled.

As described above, the relationship in the refractive index may be controlled according to, for example, the presence of the aryl group of the polyorganosiloxane or the silicon compound, and/or the control of the ratio thereof. In one embodiment, to control the relationship in the refractive index, component(s), that is, one or two components of the polyorganosiloxane (A), the polyorganosiloxane (B), and the silicon compound (C) may not include an aryl group, and the other component(s) may include an aryl group. For example, the polyorganosiloxane (A) may not include an aryl group, and the polyorganosiloxane (B) and the silicon compound (C) may include an aryl group, or the polyorganosiloxane (A) may include an aryl group and the polyorganosiloxane (B) and the silicon compound (C) may not include an aryl group.

In another example, the polyorganosiloxane (B) may not include an aryl group, and the polyorganosiloxane (A) and the silicon compound (C) may include an aryl group, or the polyorganosiloxane (B) may include an aryl group and the polyorganosiloxane (A) and the silicon compound (C) may not include an aryl group.

Ratios of respective components in the curable composition may be controlled according to a type satisfying Equation 1. For example, one component having the refractive index A in Equation 1 may be included in the curable composition in an amount of 0.1 parts by weight to 30 parts by weight with respect to 100 parts by weight of the other two components having the refractive index B. For example, the polyorganosiloxane (A) may be included in the curable composition in an amount of 0.1 to 30 parts by weight relative to 100 parts by weight of a total weight of the polyorganosiloxane (B) and the silicon compound (C), or the polyorganosiloxane (B) may be included in an amount of 0.1 parts by weight to 30 parts by weight relative to 100 parts by weight of a total weight of the polyorganosiloxane (A) and the silicon compound (C). Within the above range, the scattering characteristics of light can be controlled in a suitable range, and the mechanical strength of the cured product can be ensured. The units "parts by weight" used herein may, unless particularly defined otherwise, refer to a weight ratio between components.

In addition, here, the silicon compound (C) may be included in the curable composition to the extent that a ratio (H/Ak) of moles of a hydrogen atom (H) binding to a silicon atom included in the silicon compound (C) with respect to moles of all aliphatic unsaturated bonds included in the curable composition or functional groups including the same, for example, all alkenyl groups included in the polyorganosiloxane (A) and/or the polyorganosiloxane (B) is 0.5 or more, or 0.7 or more. The silicon compound (C) may be included in the curable composition to the extent that the ratio (H/Ak) is 2.0 or less, or 1.5 or less. Accordingly, a composition that exhibit excellent processability and workability before curing, exhibit excellent crack resistance, hardness, thermal and shock resistance, and adhesiveness, after curing, and does not cause whitening or surface stickiness under harsh conditions can be provided.

The curable composition may further include a hydrosilylation catalyst. The hydrosilylation catalyst may be used to stimulate hydrosilylation. As the hydrosilylation catalyst, any conventional component known in the art may be used. As such a catalyst, a platinum-, palladium-, or rhodium-based catalyst may be used. In the specification, a platinum-based catalyst may be used in consideration of catalyst efficiency, and may be, but is not limited to, chloroplatinic acid, platinum tetrachloride, an olefin complex of platinum, an alkenyl siloxane complex of platinum, or a carbonyl complex of platinum.

A content of the hydrosilylation catalyst is not particularly limited as long as the hydrosilylation catalyst is included at a catalytic amount, that is, an amount capable of serving as a catalyst. Conventionally, the hydrosilylation catalyst may be used at 0.1 ppm to 500 ppm or 0.2 ppm to 100 ppm based on an atomic weight of platinum, palladium, or rhodium.

The curable composition may further include a tackifier in order to enhance adhesiveness to various substrates. The tackifier is a component capable of improving self-adhesiveness, particularly, to a metal and an organic resin. The tackifier may be, but is not limited to, a silane having at least one or two functional groups selected from the group consisting of an alkenyl group such as a vinyl group, a (meth)acryloyloxy group, a hydrosilyl group (SiH group), an epoxy group, an alkoxy group, an alkoxysilyl group, a carbonyl group, and a phenyl group; or an organic silicon compound such as a cyclic or linear siloxane having 2 silicon atoms to 30 silicon atoms, or 4 silicon atoms to 20 silicon atoms. In the specification, one or at least two of the tackifiers may be additionally mixed.

The tackifier may be included in the composition in a content of 0.1 parts by weight to 20 parts by weight relative to 100 parts by weight of a total weight of other compounds included in the curable composition, for example, the polyorganosiloxane (A), the polyorganosiloxane (B), and/or the silicon compound (C), but the content can be suitably changed in consideration of desired improvement in adhesiveness.

The curable composition may further include one or at least two of additives including a reaction inhibitor such as 2-methyl-3-butyne-2-ol, 2-phenyl-3-1-butyne-2-ol, 3-methyl-3-pentene-1-yne, 3,5-dimethyl-3-hexene-1-yne, 1,3,5,7-tetramethyl-1,3,5,7-tetrahexenylcyclotetrasiloxane, or ethynylcyclohexane; an inorganic filler such as silica, alumina, zirconia, or titania; a carbon-functional silane having an epoxy group and/or alkoxysilyl group, a partial hydrolysis-condensation product thereof or a siloxane compound; a thixotropic agent such as a haze-phase silica that can be used in combination with polyether; a conductivity providing agent such as metal powder of silver, copper, or aluminum or various carbon materials; or a color adjusting agent such as a pigment or dye as needed.

The curable composition may further include, for example, inorganic particles. The particles may satisfy Equation 2.

$$|P-Q| \leq 0.1 \quad \text{[Equation 2]}$$

In Equation 2, P is a refractive index of the curable composition or a cured product thereof excluding the particles, and Q is a refractive index of the particles. The refractive index may be, for example, a refractive index with respect to light having a wavelength of 450 nm. An absolute value of the difference between P and Q may be, in another example, 0.08 or less, 0.07 or less, or 0.05 or less.

The particles can prevent precipitation of a fluorescent material that may be blended into the curable composition, enhance heat resistance, heat radiating property, and crack resistance, and improve overall reliability. In addition, the particles can serve as described above, and maintain transparency the composition or cured product to enhance, for example, brightness of the device.

As the particles, as long as satisfying Equation 2, for example, various kinds of particles used as a filler may be used. In one embodiment, the particles may have a refractive index (Q) of 1.40 or more, 1.45 or more, 1.48 or more, 1.50 or more, or 1.55 or more.

As the particles, for example, silica ($SiO_2$), organo silica, alumina, alumino silica, titania, zirconia, cerium oxide, hafnium oxide, niobium pentoxide, tantalum pentoxide, indium oxide, tin oxide, indium tin oxide, zinc oxide, silicon, zinc sulfide, calcium carbonate, barium sulfate, aluminosilicate, or magnesium oxide, and may be porous or hollow particles.

The particles may have an average diameter of, for example, 1 nm to 50 µm, or 2 nm to 10 µm. When the average diameter is 1 nm or more, the particles may be uniformly dispersed in the composition or cured product thereof, and when the average diameter is 50 µm or less, the dispersion of the particles can be effectively performed, and precipitation of the particles can be prevented.

The particles may be included in an amount of 0.1 to 30 parts by weight or 0.2 to 10 parts by weight relative to 100 parts by weight of a total weight of the polyorganosiloxane (A) or the polyorganosiloxane (B) and the silicon compound (C). When the content of the particles is 0.1 parts by weight or more, excellent inhibition of the precipitation of a phosphor or enhancement of reliability of the device can be ensured, and when the content of the particles is 30 parts by weight or less, processability can be excellently maintained.

The curable composition may further include a fluorescent material. In this case, a kind of a fluorescent material which can be used is not particularly limited, and for example, a conventional kind of a fluorescent material applied to an LED package may be used to realize white light.

Another aspect of the present application provides a semiconductor element, for example, an optical semiconductor element. The illustrative semiconductor element may be encapsulated by an encapsulant including a cured product of the curable composition. Examples of a semiconductor element encapsulated by an encapsulant include a diode, a transistor, a thyristor, a photocoupler, a CCD, a solid-phase image pick-up diode, a monolithic IC, a hybrid IC, an LSI, a VLSI, or a light-emitting diode (LED). In one embodiment, the semiconductor element may be an LED.

The LED may be formed by stacking a semiconductor material on a substrate. The semiconductor material may be, but is not limited to, GaAs, GaP, GaAlAs, GaAsP, AlGaInP, GaN, InN, AlN, InGaAlN, or SiC. In addition, as the substrate, monocrystalline sapphire, spinel, SiC, Si, ZnO, or GaN may be used.

In addition, to prepare the LED, when necessary, a buffer layer may be formed between a substrate and a semiconductor material. As the buffer layer, GaN or MN may be used. A method of stacking a semiconductor material on a substrate may be, but is not particularly limited to, MOCVD, HDVPE, or liquid growth. In addition, a structure of the LED may be, for example, a monojunction including an MIS junction, a PN junction, and a PIN junction, a heterojunction, or a double heterojunction. In addition, the LED may be formed using a single or multiple quantum well structure.

In one embodiment, an emission wavelength of the LED may be, for example, 250 nm to 550 nm, 300 nm to 500 nm, or 330 nm to 470 nm. The emission wavelength may refer to a main emission peak wavelength. As the emission wavelength of the LED is set in the above range, a white LED having a longer lifespan, high energy efficiency, and high color expression can be obtained.

The LED may be encapsulated using the composition. In addition, the encapsulation of the LED may be performed only using the composition, and in some cases, another encapsulant may be used in combination with the composition. When two kinds of encapsulant are used in combination, after the encapsulation using the composition, the encapsulated LED may also be encapsulated with another encapsulant. Alternatively, the LED may be first encapsulated with the other encapsulant and then encapsulated again with the composition. As the other encapsulant, an epoxy resin, a silicon resin, an acryl resin, a urea resin, an imide resin, or glass may be used.

To encapsulate the LED with the composition, for example, a method including injecting the composition into a mold beforehand, dipping a lead frame to which the LED is fixed therein, and curing the composition, or a method including injecting the composition into a mold into which the LED is inserted and curing the composition may be used. As a method of injecting the composition, injection by a dispenser, transfer molding, or injection molding may be used. In addition, as other encapsulating methods, a method of dropping the composition on the LED, screen printing, coating the composition by screen printing or using a mask and curing the composition, and a method of injecting the composition into a cup in which the LED is disposed on its bottom by a dispenser and curing the composition may be included.

In addition, the composition may be used as a diamond material fixing the LED to a lead terminal or package, or a passivation layer or package substrate on the LED as needed.

When it is necessary to cure the composition, the curing is not particularly limited, and may be performed, for example, by maintaining the composition at a temperature of 60° C. to 200° C. for 10 minutes to 5 hours, or in 2 or more steps at suitable temperatures and for suitable amounts of time.

A shape of the encapsulant is not particularly limited, and for example, may be a bullet-shaped lens, planar shape, or thin film shape.

In addition, further enhancement of performance of the LED may be promoted according to conventional methods known in the art. To enhance performance, for example, a method of disposing a reflective layer or light collecting layer on a back surface of the LED, a method of forming a complementary coloring part on its bottom, a method of disposing a layer absorbing light having a shorter wavelength than the main emission peak on the LED, a method of encapsulating the LED and further molding the LED with a hard material, a method of inserting the LED into a through hole to be fixed, or a method of contacting the LED with a lead member by flip-chip contact to extract light from a direction of the substrate, may be used.

The optical semiconductor, for example, the LED may be effectively applied to, for example, backlights for liquid crystal displays (LCDs), lights, various kinds of sensors, light sources of a printer and a copy machine, light sources for an automobile gauge, signal lights, pilot lights, display devices, light sources of planar-type LEDs, displays, decorations, or various kinds of lights.

Advantageous Effects

A curable composition having no problems of discoloring even when used for a long time due to excellent processability, workability, heat resistance, and light resistance can be provided. The curable composition which can scatter light, and disperse linearity of light when used as an encapsulant of an optical semiconductor such as an LED can be provided.

MODE FOR CARRYING OUT THE INVENTION

Hereinafter, a curable composition according to the present application will be described in further detail with reference to Examples and Comparative Examples, but the scope of the curable composition is not limited to the following Examples.

Hereinafter, the abbreviation "Vi" refers to a vinyl group, the abbreviation "Ph" refers to a phenyl group, and the abbreviation "Me" refers to a methyl group.

1. Measurement of Light Transmittance

A curable composition was injected between two glass substrates spaced approximately 1 mm apart from each other and cured at 150° C. for 1 hour, thereby preparing a planar sample having a thickness of 1 mm. Subsequently, light transmittance of the sample in a thickness direction with respect to a wavelength of 450 nm was measured using a UV-VIS spectrometer at room temperature and then evaluated according to the following criteria.

<Criteria for Evaluating Light Transmittance>
○: light transmittance of 70% or more
X: light transmittance of less than 70%

2. Evaluation of Light Scattering Degree

A curable composition was injected between two glass substrates spaced approximately 2 cm apart from each other and cured at 150° C. for 1 hour, thereby preparing a planar sample. Subsequently, the cured planar sample was placed on a letter-printed paper, and the letters were observed with the naked eye, thereby evaluating a light scattering degree according to the following criteria.

<Criteria for Evaluating Light Scattering Degree>
○: the letters printed underneath were not recognized with the naked eye
X: the letters printed underneath were recognized with the naked eye 3. Evaluation of Heat Resistance A curable composition was injected between two glass substrates spaced approximately 1 mm apart from each other and cured at 150° C. for 1 hour, thereby preparing a planar sample having a thickness of 1 mm. The sample was left at 150° C. for approximately 500 hours, and the occurrence of yellowing or not was observed, thereby the sample was evaluated according to the following criteria.

<Criteria for Evaluating Heat Resistance>
○: yellowing was not observed
X: yellowing was observed 4. Evaluation of Refractive Index Refractive indexes of respective components of the curable composition were measured with respect to light having a wavelength of 450 nm using an Abbe refractometer.

Example 1

A curable composition was prepared by mixing 30 g of a polyorganosiloxane of Formula A, 100 g of a polyorganosiloxane of Formula B, 200 g of a polyorganosiloxane of Formula C, and 50 g of a polyorganosiloxane of Formula D, blending a catalyst (platinum(0)-1,3-divinyl-1,1,3,3-tetramethyldisiloxane) to have a content of Pt(0) of 5 ppm, and uniformly mixing the resulting mixture. Here, an absolute value of a difference between a refractive index (A) of the polyorganosiloxane of Formula A and a refractive index (B) of a mixture of the polyorganosiloxanes of Formulas B, C, and D was 0.09.

$(ViMe_2SiO_{1/2})_2(Me_2SiO_{2/2})_{40}$     [Formula A]

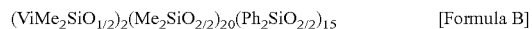

$(ViMe_2SiO_{1/2})_2(Me_2SiO_{2/2})_{20}(Ph_2SiO_{2/2})_{15}$     [Formula B]

$(ViMe_2SiO_{1/2})_2(PhSiO_{3/2})_8$     [Formula C]

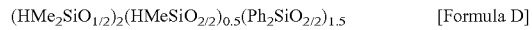

$(HMe_2SiO_{1/2})_2(HMeSiO_{2/2})_{0.5}(Ph_2SiO_{2/2})_{1.5}$     [Formula D]

Example 2

A curable composition was prepared by mixing 30 g of a polyorganosiloxane of Formula E, 300 g of a polyorganosiloxane of Formula F, and 70 g of a polyorganosiloxane of Formula G, blending a catalyst (platinum(0)-1,3-divinyl-1,1,3,3-tetramethyldisiloxane) to have a content of Pt(0) of 5 ppm, and uniformly mixing the resulting mixture. Here, an absolute value of a difference between a refractive index (A) of the polyorganosiloxane of Formula E and a refractive index (B) of a mixture of the polyorganosiloxanes of Formulas F and G was 0.07.

[ViMe$_2$SiO$_{1/2}$]$_2$[Me$_2$SiO$_{2/2}$]$_{40}$[MeSiO$_{3/2}$]$_5$  [Formula E]

[ViMeSiO$_{2/2}$]$_2$[PhSiO$_{3/2}$]$_{6.5}$  [Formula F]

[HMe$_2$SiO$_{1/2}$]$_2$[HMeSiO$_{2/2}$]$_{0.5}$[Ph$_2$SiO$_{2/2}$]$_{1.5}$  [Formula G]

Example 3

A curable composition was prepared by mixing 30 g of a polyorganosiloxane of Formula H, 100 g of a polyorganosiloxane of Formula I, 20 g of a polyorganosiloxane of Formula J, and 20 g of a polyorganosiloxane of Formula K, blending a catalyst (platinum(0)-1,3-divinyl-1,1,3,3-tetramethyldisiloxane) to have a content of Pt(0) of 5 ppm, and uniformly mixing the resulting mixture. Here, an absolute value of a difference between a refractive index (A) of the polyorganosiloxane of Formula H and a refractive index (B) of a mixture of the polyorganosiloxanes of Formulas I, J, and K was 1.1.

(ViMe$_2$SiO$_{1/2}$)$_2$(Me$_2$SiO$_{2/2}$)$_{20}$(Ph$_2$SiO$_{2/2}$)$_{20}$  [Formula H]

(ViMe$_2$SiO$_{1/2}$)(Me$_3$SiO$_{1/2}$)$_3$(SiO$_{4/2}$)$_2$  [Formula I]

(ViMe$_2$SiO$_{1/2}$)$_2$(Me$_2$SiO$_{2/2}$)$_{70}$  [Formula J]

(Me$_3$SiO$_{1/2}$)$_2$(HMeSiO$_{2/2}$)$_{35}$  [Formula K]

Comparative Example 1

A curable composition was prepared by the same method as described in Example 1, except that the polyorganosiloxane of Formula A was not used.

Comparative Example 2

A curable composition was prepared by the same method as described in Example 3, except that the polyorganosiloxane of Formula H was not used.

Comparative Example 3

A curable composition was prepared by the same method as described in Example 1, except that the polyorganosiloxane of Formula A was not used and 30 g of polystyrene particles were blended instead.

TABLE 1

|  |  | Light transmittance | Light scattering degree | Heat resistance |
|---|---|---|---|---|
| Example | 1 | ○ | ○ | ○ |
|  | 2 | ○ | ○ | ○ |
|  | 3 | ○ | ○ | ○ |
| Comparative Example | 1 | X | X | ○ |
|  | 2 | X | X | ○ |
|  | 3 | X | X | X |

What is claimed is:

1. A curable composition satisfying Equation 1, comprising:
   (A) a polyorganosiloxane having an average compositional formula of Formula 1;
   (B) a polyorganosiloxane having an average compositional formula of Formula 2; and
   (C) a compound of Formula 3:

$(R^1_3SiO_{1/2})_a(R^1_2SiO_{2/2})_b(R^1SiO_{3/2})_c(SiO_{4/2})_d$  [Formula 1]

$(R^2_3SiO_{1/2})_e(R^2_2SiO_{2/2})_f(R^2SiO_{3/2})_g(SiO_{4/2})_h$  [Formula 2]

$H_iY_jSiO_{(4-i-j)/2}$  [Formula 3]

$|A-B|>0.03$  [Equation 1]

where $R^1$, $R^2$, and Y are each independently an epoxy group or a monovalent hydrocarbon group, with the proviso that at least one of $R^1$ or at least one of $R^2$ is an alkenyl group; a is 0 or a positive number, b is a positive number, c is 0 or a positive number, d is 0 or a positive number, b/(b+c+d) is 0.65 or more, e is 0 or a positive number, f is 0 or a positive number, g is 0 or a positive number, and h is 0 or a positive number, f/(f+g+h) is less than 0.65, with the proviso that g and h are not simultaneously 0; i is 0.2 to 1, j is 0.9 to 2, and A is a refractive index of the polyorganosiloxane (A), and B is a refractive index of a mixture of the polyorganosiloxane (B) and the compound (C).

2. The curable composition according to claim 1, wherein the polyorganosiloxane (A) is comprised in an amount of 0.1 to 30 parts by weight relative to 100 parts by weight of a total weight of the polyorganosiloxane (B) and the silicon compound (C).

3. The curable composition according to claim 2, wherein a ratio (H/Ak) of moles of a hydrogen atom (H) binding to a silicon atom in the silicon compound (C) with respect to moles of alkenyl groups (Ak) in the polyorganosiloxane (A) and the polyorganosiloxane (B) is from 0.5 to 2.0.

4. The curable composition according to claim 1, wherein A of the Equation 1 is a refractive index of the polyorganosiloxane (B), and B of the Equation 1 is a refractive index of a mixture of the polyorganosiloxane (A) and the compound (C).

5. The curable composition according to claim 4, wherein the polyorganosiloxane (B) is comprised in an amount of 0.1 to 30 parts by weight relative to 100 parts by weight of a total weight of the polyorganosiloxane (A) and the silicon compound (C).

6. The curable composition according to claim 1, wherein at least one of $R^1$'s in Formula 1 is an aryl group.

7. The curable composition according to claim 1, wherein at least one of $R^2$'s in Formula 2 is an aryl group.

8. The curable composition according to claim 1, wherein f/(f+g+h) in Formula 2 is 0.4 or less.

9. The curable composition according to claim 1, wherein g/(g+h) in Formula 2 is 0.8 or more.

10. The curable composition according to claim 1, wherein at least one of Y's in Formula 3 is an aryl group.

11. The curable composition according to claim 1, wherein one or two of the polyorganosiloxane (A), the polyorganosiloxane (B), and the compound (C) does not comprise an aryl group, and the other component comprises an aryl group.

12. The curable composition according to claim 11, wherein the polyorganosiloxane (A) does not comprise an aryl group, and the polyorganosiloxane (B) and the silicon compound (C) comprise an aryl group.

13. The curable composition according to claim 11, wherein the polyorganosiloxane (A) comprises an aryl group, and the polyorganosiloxane (B) and the silicon compound (C) do not comprise an aryl group.

14. The curable composition according to claim 11, wherein the polyorganosiloxane (B) does not comprise an aryl group, and the polyorganosiloxane (A) and the silicon compound (C) comprise an aryl group.

15. The curable composition according to claim 11, wherein the polyorganosiloxane (B) comprises an aryl group, and the polyorganosiloxane (A) and the silicon compound (C) do not comprise an aryl group.

16. An optical semiconductor encapsulated by the cured composition of claim 1.

17. A liquid crystal display comprising the optical semiconductor of claim 16 in a backlight unit.

18. A light apparatus comprising the optical semiconductor of claim 16.

* * * * *